United States Patent
Muta et al.

(10) Patent No.: US 7,125,810 B2
(45) Date of Patent: Oct. 24, 2006

(54) SEMICONDUCTOR DEVICE AND METHOD OF MANUFACTURING SEMICONDUCTOR DEVICE

(75) Inventors: Tadayoshi Muta, Saitama (JP); Jin Tachikawa, Tokyo (JP); Riichi Saito, Kanagawa (JP); Tadanori Suto, Tokyo (JP); Manabu Takayama, Kanagawa (JP); Hiroyuki Morimoto, Ibaraki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/964,714

(22) Filed: Oct. 15, 2004

(65) Prior Publication Data
US 2005/0067713 A1    Mar. 31, 2005

Related U.S. Application Data

(62) Division of application No. 10/347,937, filed on Jan. 22, 2003, now Pat. No. 6,856,023.

(30) Foreign Application Priority Data
Jan. 22, 2002  (JP) .............................. 2002-012834
Dec. 12, 2002  (JP) .............................. 2002-360904

(51) Int. Cl.
*H01L 21/31*    (2006.01)
(52) U.S. Cl. ...................... 438/758; 438/778; 438/619
(58) Field of Classification Search ............... 438/778, 438/619, 758, 121
See application file for complete search history.

(56) References Cited

U.S. PATENT DOCUMENTS

| | | | |
|---|---|---|---|
| 4,601,916 A | 7/1986 | Arachtingi | 427/97 |
| 5,421,083 A | 6/1995 | Suppelsa et al. | 29/852 |
| 6,089,442 A | 7/2000 | Ouchi et al. | 228/180.1 |
| 6,159,754 A | 12/2000 | Li et al. | 438/4 |
| 6,180,261 B1 | 1/2001 | Inoue et al. | 428/626 |
| 6,221,751 B1 | 4/2001 | Chen et al. | 438/612 |
| 6,320,691 B1 | 11/2001 | Ouchi et al. | 359/237 |
| 6,590,291 B1 | 7/2003 | Akagawa | 257/774 |
| 6,605,551 B1 * | 8/2003 | Wermer et al. | 438/778 |
| 6,720,661 B1 | 4/2004 | Hanaoka et al. | 257/774 |
| 2002/0030245 A1 | 3/2002 | Hanaoka et al. | 257/621 |

FOREIGN PATENT DOCUMENTS

| | | |
|---|---|---|
| CN | 1327263 | 12/2001 |
| EP | WO 99/08318 | 2/1999 |
| FR | 2 767 223 | 2/1999 |
| JP | 4-10649 | 1/1992 |
| JP | 9-92675 | 4/1997 |

OTHER PUBLICATIONS

Office Action from Korean counterpart application 10-2003 0004220, dated Nov. 9, 2005 (with copy of English translation).

* cited by examiner

*Primary Examiner*—Roy Karl Potter
(74) *Attorney, Agent, or Firm*—Fitzpatrick, Cella, Harper & Scinto

(57) ABSTRACT

The semiconductor device of the present invention comprises a substrate; at least one through hole formed through the substrate between front and back surfaces of the substrate; an electrical connection portion formed by a semiconductor process on at least one surface of the front and back surfaces of the substrate in a vicinity of an end opening of the through hole; an insulating layer formed of an organic material on an inside surface of the through hole; and an electroconductive layer formed on an inside surface of the insulating layer, wherein the electrical connection portion is electrically connected to the electroconductive layer to be electrically connected to a side of the other surface of the substrate.

6 Claims, 8 Drawing Sheets

SEMICONDUCTOR DEVICE AND METHOD OF MANUFACTURING SEMICONDUCTOR DEVICE

This application is a division of U.S. application Ser. No. 10/347,937, filed Jan. 22, 2003 now U.S. Pat. No. 6,856,023, the entire content of which is incorporated herein by reference.

BACKGROUND OF THE INVENTION

1. Field of the Invention

The present invention relates to a semiconductor device having semiconductor elements formed on its surface and to a method of manufacturing the semiconductor device.

2. Related Background Art

Semiconductor devices have been formed in such a manner that wiring and electrode pads are formed on a substrate such as a semiconductor substrate or a glass substrate by a semiconductor process, and a plurality of semiconductor chips are mounted on the surface of the substrate. With the miniaturization of semiconductor devices, there has been an increased need to reduce the size of the semiconductor devices and to increase the mounting density. To meet this need, connections from the back surface of a substrate to external terminals are made by providing electrical conduction between the front and back surfaces of the substrate, the back surface of the substrate is used for wiring by providing electrical conduction between the front and back surfaces, or three-dimensional mounting is performed in such a manner that a plurality of substrates are stacked and electrical connections are made between the front and back surfaces of the substrates.

Methods for providing electrical conduction between the front and back surfaces of a substrate by using a through hole formed through the substrate are known. Japanese Patent Application Laid-Open No. 9-92675 discloses a method of manufacturing a semiconductor device in which electrical conduction is provided between the front and back surfaces of a substrate by using a through hole formed through the substrate.

In the method disclosed in Japanese Patent Application Laid-Open No. 9-92675, protective layer and openings where no protective layer is formed are first formed on the front and back surfaces of a substrate on which semiconductor elements are formed in advance. Subsequently, etching with an etchant corrosive to the semiconductor substrate or etching using water jetting or laser capable of etching a small-area portion is effected at openings until the semiconductor substrate is etched through, thereby forming through holes. Subsequently, an insulating layer is formed on the front surface of the semiconductor substrate and the inside surfaces of the through holes by using thermal oxidation or chemical vapor deposition. The through holes are then closed by chemical vapor deposition or plating and electrically electroconductive layers are formed on the front and back surfaces of the substrate. Thereafter, the electroconductive layers on the front and back surfaces of the semiconductor substrate are etched back. Portions of the electroconductive layers on front and back surfaces of the semiconductor substrate other than the portions of the electroconductive layers in the through holes of the semiconductor substrate are thereby removed. Thereafter, openings are selectively formed in the protective layer and the insulating layer covering the semiconductor elements formed on the front surface of the semiconductor substrate. Subsequently, a first surface layer wiring film is formed on the substrate surface by using chemical vapor deposition, physical vapor deposition or plating. Subsequently, the first surface layer wiring film is selectively etched to form first surface layer wiring, which connects the semiconductor elements and the conductors formed in the through holes. The semiconductor elements and the first surface layer wiring are connected by the above-described process, thus providing electrical conduction from the semiconductor elements to the back surface of the semiconductor substrate via the through holes.

Japanese Patent Application Laid-Open No. 4-10649 discloses a method of manufacturing a semiconductor device in which electrical conduction is provided between the front and back surfaces of a semiconductor substrate via a through hole formed through the semiconductor substrate. Circuits and electrode pads are formed on a surface of a semiconductor substrate. Through holes are formed in the semiconductor substrate at positions at which the electrode pads are formed. Thereafter, an insulating material is stacked on the semiconductor substrate by chemical vapor deposition to fill the through holes with the insulating material. Holes smaller than the through holes are then formed through the insulating material in the through holes to expose the electrode pads at the other surface side of the semiconductor substrate. A layer of an electroconductive material such as Al is thereafter formed at the through holes by vacuum deposition and patterning is performed on the layer to form connection pads connecting to the electrode pads.

In recent years, through holes in semiconductor devices have been used in various fields, e.g., in integrated circuit substrates employed in stacked multi-chip packages (MCPs), semiconductor memories, complementary metal-oxide semiconductor (CMOS) sensors, and auto-focus (AF) sensors, micromachines, etc., in semiconductor packages in which a plurality of semiconductor chips are stacked, and for connection of ink jet heads to main units. In a case where through holes are formed in a semiconductor device for electrical conduction between front and back surfaces, if semiconductor elements or electrode pads electrically connected to semiconductor elements are formed after the formation of the through holes, there is a need to again form a wiring pattern or the like after the formation of the semiconductor elements or the electrode pads and the manufacturing process becomes complicated, resulting in an increase in manufacturing cost. To simplify the manufacturing process to reduce the manufacturing cost, a procedure is required in which semiconductor elements and electrode pads electrically connected to the semiconductor elements are formed in the vicinity of opening ends of through holes in a semiconductor substrate by using a semiconductor process, and the through holes are thereafter formed in the semiconductor substrate.

In the art disclosed in the above-mentioned Japanese Patent Application Laid-Open No. 9-92675, however, a thermal oxidation treatment is used as a step of forming an insulating layer. In ordinary cases, a thermal oxidation treatment is performed at a high temperature of 1000° C. or higher to form a dense oxide film. It is known that in ordinary cases a failure can occur in the function of a semiconductor element when the semiconductor element is subjected to a high temperature of 600° C. or higher. Also, it is highly possible that an electrode pad formed on an electroconductive substrate by gold plating or the like will separate from the substrate if it is subjected to a high temperature of 600° C. or higher. Therefore it is difficult to use a step of forming an insulating layer by a thermal oxidation treatment in a case where semiconductor elements and electrode pads are formed on a semiconductor substrate in advance.

In Japanese Patent Application Laid-Open No. 9-92675 and Japanese Patent Application Laid-Open No. 4-10649, use of chemical vapor deposition as a step of forming an insulating layer is described. However, it is difficult to use thermal CVD among chemical vapor deposition methods in a case where semiconductor elements and electrode pads are formed on a substrate in advance, since thermal CVD ordinarily requires heating at a high temperature of 600° C. or higher, as in the case of the above-mentioned thermal oxidation treatment.

In a case where the inside surface of a through hole in a substrate is made electroconductive, for example, for the reason that the substrate is electroconductive, a leak occurs between the electroconductive semiconductor substrate and an electroconductive layer formed on the inside surface of the insulating layer, resulting in failure in the functions of the semiconductor device using the substrate. With the increase in the degree of integration or in packaging density of semiconductor devices, through holes have become reduced in bore diameter, and the aspect ratio, i.e., the ratio of the depth and the bore diameter of through holes, is increasing. Therefore there is also a need to form an insulating layer uniform in thickness and perfectly defect-free in through holes having higher aspect ratios.

However, according to the chemical vapor deposition methods described in Japanese Patent Application Laid-Open No. 9-92675 and Japanese Patent Application Laid-Open No. 4-10649, an insulating layer is ordinarily formed on the entire front and back surfaces of a semiconductor substrate as well as in a through hole. The forming speed of an insulating layer in a through hole is extremely small in comparison with that at the front and back surfaces of a semiconductor substrate, since the gas cannot easily enter the through hole and cannot circulate well. Thus, it is difficult to efficiently form an insulating layer on the inside surface of a through hole. It is also difficult to maintain the uniformity of formed layer. This phenomenon becomes noticeable in a case where an insulating film is formed on the inside surface of a through hole having a high aspect ratio or a small-diameter through hole. In particular, it is extremely difficult to form, by chemical vapor deposition, a uniform layer in a through hole of a semiconductor chip for ordinarily use when the aspect ratio is 5 or higher or when the inside diameter is 100 µm or smaller.

Also, the forming speed of an insulating layer formed in the inside surf-ace of a through hole is higher at the opening end of the through hole than at an inner portion of the through hole for the above-described reason. As a result, the film becomes thicker at the opening end of the through hole and thinner at the inner position. Thus, in some cases, there is high possibility of failure to insulate an inner portion of a through hole due to the existence of a defective portion of an insulating layer.

SUMMARY OF THE INVENTION

In view of the above-described circumstances, an object of the present invention is to provide at a low cost a semiconductor device in which reliable electrical conduction is provided between front and back surfaces of a substrate. Another object of the present invention is to provide an improved semiconductor device using a through hole with a high aspect ratio and a small diameter as accompanying the tendency toward improvements in degree of integration and packaging density.

To achieve the above-described objects, according to one aspect of the present invention, there is provided a semiconductor device in which an electrical connection is established between front and back surfaces of a substrate by means of at least one through hole formed through the substrate between the front and back surfaces, the semiconductor device comprising an electrical connection portion formed on at least one surface of the front and back surfaces of the substrate in the vicinity of the opening end of the through hole by a semiconductor process, an insulating layer formed of an organic material on at least an inside surface of the through hole, and an electroconductive layer formed on at least an inside surface of the insulating layer, wherein the electrical connection portion is electrically connected to the electroconductive layer to be electrically connected to a side of the other surface of the substrate. Thus, an improved semiconductor device is provided in which reliable electrical connection is provided between the front and back surfaces of the substrate.

According to another aspect of the present invention, there is provided a semiconductor device in which an electrical connection is established between front and back surfaces of a substrate, the semiconductor device comprising at least one groove connecting the front and back surfaces of the substrate and formed in a side surface of the substrate, an electrical connection portion formed on at least one surface of the front and back surfaces of the substrate in the vicinity of an end of the groove by a semiconductor process, an insulating layer formed of an organic material on at least an inside surface of the through hole, and an electroconductive layer formed on at least an inside surface of the insulating layer, wherein the electrical connection portion is electrically connected to the electroconductive layer to be electrically connected to a side of the other surface of the substrate. This arrangement ensures that the area of the substrate can be reduced to reduce the size of the semiconductor device. The number of semiconductor devices formable from one wafer can also be increased to effectively reduce the manufacturing cost of the semiconductor device.

According to still another aspect of the present invention, there is provided a method of manufacturing a semiconductor device in which a substrate having an electrical connection portion formed on at least one surface of the front and back surfaces of a substrate by a semiconductor process is prepared; at least one through hole is formed in the substrate at a predetermined position; an insulating layer formed of an organic material is formed on at least an inside surface of the through hole; and an electroconductive layer electrically connected to the electrical connection portion is formed on at least an inside surface of the insulating layer to electrically connect the electrical connection portion to a side of the other surface of the substrate. This method ensures that a semiconductor device in which reliable electrical conduction is provided between the front and back surfaces can be provided at a low cost.

According to a further aspect of the present invention, there is provided a method of manufacturing a semiconductor device, by which a substrate having an electrical connection portion formed on at least one surface of the front and back surfaces of a substrate by a semiconductor process is prepared; at least one through hole is formed in the substrate at a predetermined position; an insulating layer formed of an organic material is formed on at least an inside surface of the through hole; an electroconductive layer electrically connected to the electrical connection portion is formed on at least an inside surface of the insulating layer; and the substrate is cut so that the through hole is bisected to electrically connect the electrical connection portion to a side of the other surface of the substrate via a side surface of the substrate. This method ensures that the area of the substrate can be reduced to reduce the size of the semiconductor device. The number of semiconductor devices formable from one wafer can also be increased to effectively reduce the manufacturing cost of the semiconductor device.

According to the present invention, there are also provided a semiconductor device and a method of manufacturing the semiconductor device, wherein the above-mentioned organic material is a binder resin to be cured at a temperature equal to or lower than 400° C. Therefore a semiconductor device can be formed without using a process at a high temperature equal to or higher than 600° C., and the manufacturing process can be simplified to reduce the manufacturing cost.

According to the present invention, there are also provided a semiconductor device and a method of manufacturing the semiconductor device, wherein the above-mentioned binder resin is one selected from the group consisting of a denatured epoxy resin, a polyamide resin, a polyimide resin, a maleimide resin, a polyimide-amide resin, a polyester resin, a polyether resin, a bisphenol resin, a denatured acrylic resin, a silicone resin, a fluorocarbon resin, and a melamine resin, or a resin mixture obtained by suitably combining these resins, and is cured with one of polymerization reaction-generated bonding, condensation reaction-generated bonding, addition reaction-generated bonding, urethane bonding, urea bonding, ester bonding, ether bonding, carbonate bonding, thiourethane bonding, thioester bonding, thioether bonding, amide bonding, unsaturated bonding, and siloxane bonding. Therefore a semiconductor device can be formed without using a process at a high temperature equal to or higher than 600° C., and the manufacturing process can be simplified to reduce the manufacturing cost.

According to the present invention, there are further provided a semiconductor device and a method of manufacturing the semiconductor device, wherein the above-described substrate is a semiconductor substrate. In many cases, semiconductor substrates are electroconductive. The above-described semiconductor device and semiconductor device manufacturing method can easily be applied to devices using such substrates.

According to the present invention, there is further provided a semiconductor device in which the aspect ratio of the above-described through hole is in the range from 5 to 60. The above-described semiconductor device and semiconductor device manufacturing method have more marked effects when the aspect ratio of the through hole is high.

According to the present invention, there is further provided a semiconductor device in which the inside diameter of the above-described through hole is in the range from 5 μm to 100 μm. The above-described semiconductor device and semiconductor device manufacturing method have more marked effects when the inside diameter of the through hole is small.

According to the present invention, there is further provided a semiconductor device in which the above-described electrical connection portion is formed in the shape of a circular ring so as to encircle the opening end of said through hole. In this case, a reliable connection can be established between the electrical connection portion and the electroconductive layer.

According to the present invention, there is further provided a semiconductor device in which the above-described insulating layer is formed only on the inside surface of the through hole. In this case, the thickness of the substrate in the vicinity of the opening end of the through hole can be reduced and the overall thickness of the semiconductor device can be reduced.

According to the present invention, there is further provided a semiconductor device in which the above-described electrical connection portion is adjacent to the opening end of said through hole. In this case, the thickness of the substrate in the vicinity of the opening end of the through hole can be reduced by an amount corresponding to the difference between the thickness of the protective layer and the thickness of the electrode pad.

According to the present invention, there is further provided a semiconductor device in which the above-describe-d electrical connection portion is rectangular. In this case, the vacant space in the vicinity of the opening end of the through hole is increased, so that the regions on the front and back surfaces of the substrate can be effectively utilized to enable packaging at a higher density.

According to the present invention, there is further provided a semiconductor device in which the above-described electrical connection portion comprises wiring. In this case, there is no need to from the electrode pad and the manufacturing cost of the semiconductor device can be reduced.

According to the present invention, there is further provided a semiconductor device in which another electrical connection portion electrically connected to the electroconductive layer is also formed on the other surface of the substrate. In this case, a semiconductor device formation surface can also be provided in the other surface of the substrate, so that the regions on the front and back surfaces of the substrate can be effectively utilized to enable packaging at a higher density.

According to the present invention, there are further provided a semiconductor device and a method of manufacturing the semiconductor device, wherein the space inside the electroconductive layer formed in the above-described through hole is filled with a filling material. Degradation of the electroconductive layer and the insulating layer with the elapse of time due to contamination with foreign materials or contact with external air for example is thereby prevented. It is possible to further improve the reliability of the semiconductor substrate in this way.

According to the present invention, there are further provided a semiconductor device and a method of manufacturing the semiconductor device, wherein the above-mentioned filling material is an insulating material. Even if the filling material is attached to the surface of the substrate in the filling step, it does not cause a short circuit of a conductor exposed in the surface of the substrate unlike a electroconductive filling material.

According to the present invention, there is further provided a method of manufacturing a semiconductor device, wherein the above-described through hole is formed by laser machining. In this case, the through hole perpendicular to the surface of the substrate can be easily formed, so that the spaces on the front and back surfaces of the substrate can be effectively utilized.

According to the present invention, there is further provided a method of manufacturing a semiconductor device, wherein the above-described insulating layer is formed by a liquid phase method using processing at a temperature equal to or lower than 400° C. In this case, a semiconductor device can be formed without using a process at a high temperature of 600° C. or higher and the manufacturing process can be simplified to reduce the manufacturing cost.

According to the present invention, there is further provided a method of manufacturing a semiconductor device, wherein the above-mentioned liquid phase method is electrodeposition method. In this case, a semiconductor device can be formed without using a process at a high temperature of 600° C. or higher and the manufacturing process can be simplified to reduce the manufacturing cost. Also, the insulating film can be uniformly formed with reliability only in necessary places.

According to the present invention, there is further provided a method of manufacturing a semiconductor device, wherein the above-described electroconductive layer is formed by electroless plating. In this case, the electroconductive film can be easily formed even on the surface of the insulating layer in a short time.

According to the present invention, there is further provided a method of manufacturing a semiconductor device, wherein filling of the through hole with the filling material is performed by a step of placing the substrate in a vacuum atmosphere, a step of closing one of the opening end of the through hole, a step of applying the filling material to a position corresponding to the other opening end in the surface level of the substrate, and a step of pressuring the filing material from the other opening end of the through hole. This method ensures that filling can be completed with no void left in the through hole. There is no possibility of a void expanding with increasing temperature to press the electroconductive layer and thereby cause variation in resistance value or a break in the electroconductive layer. Consequently, the reliability of the semiconductor device can be improved.

The above and other objects, features, and advantages of the invention will become more apparent from the following detailed description taken in conjunction with the accompanying drawings.

DETAILED DESCRIPTION OF THE PREFERRED EMBODIMENTS

Embodiments of semiconductor devices and methods for manufacture of the semiconductor devices will be described in order with reference to the accompanying drawings.

Embodiment 1

A semiconductor device and a manufacturing method which represent Embodiment 1 of the present invention will be described with reference to FIG. 1, FIG. 2, and FIGS. 3A through 3G.

Figure 1:
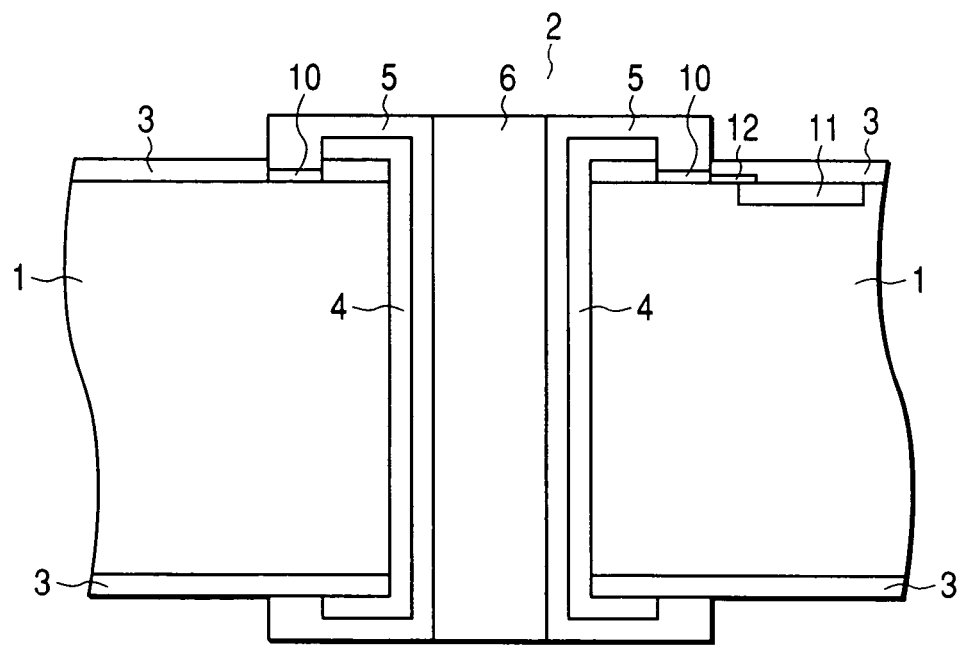
FIG. 1 is a cross-sectional view of the structure of a semiconductor device according to Embodiment 1 of the present invention.
Figure 2:
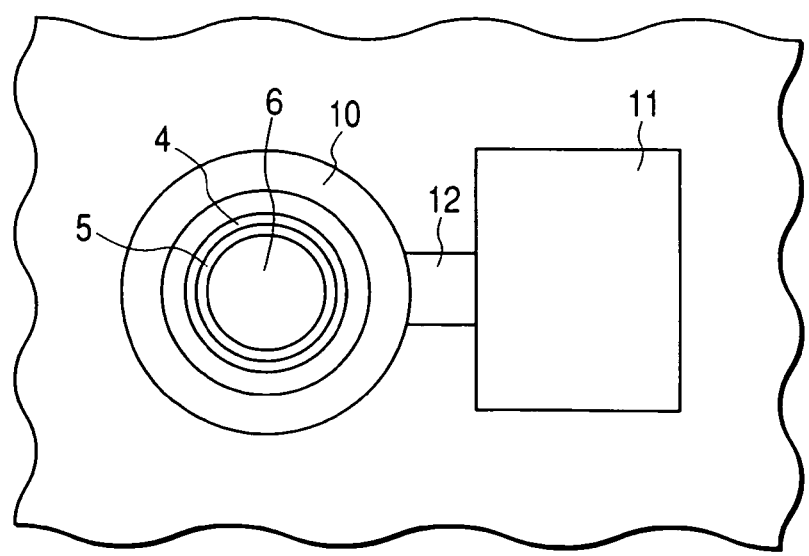
FIG. 2 is a top view of the structure of the semiconductor device according to Embodiment 1.

FIG. 1 is a schematic cross-sectional view of a portion of a substrate of the semiconductor device according to Embodiment 1 in which a through hole is formed, and FIG. 2 is a top perspective view of the substrate, showing an internal portion for ease of explanation. The substrate of the semiconductor device is indicated by 1. A through hole 2 is formed through the substrate 1 between front and back surfaces of the substrate. A protective layer 3 is formed on each of the front and back surfaces of the substrate. An insulating layer 4 of an organic material is formed on the inner surface of the through hole 2, and on the front and back surfaces of the substrate 1 around the opening ends of the through hole 2. An electroconductive layer 5 is formed on the inner surface so as to cover the insulating layer 4. The electroconductive layer 5 is formed on the inner surface inside the portion of the insulating layer 4 formed on the inside surface of the through hole 2, and on the portion of the insulating layer 4 around the opening end of the through hole 2 at the front surface side. The electroconductive layer 5 is also formed on the surface of the insulating layer 4 formed on the back surface side of the substrate 1 around the opening end of the through hole 2 on the back surface side of the substrate 1. The space left in the through hole 2 inside the electroconductive layer 5 is filled with a filling material 6. An electrode pad 10 provided as an electric connection portion is formed in the shape of a circular ring so as to surround the opening end of the through hole 2. A semiconductor element is indicated by 11. Wiring conductor 12 electrically connects the semiconductor element 11 and the electrode pad 10. Wiring conductor 12 extends linearly from a portion of the electrode pad 10. An insulating film (not shown) is formed between the electrode pad 10 and the substrate 1 and between the wiring 12 and the substrate 1. The electrode pad 10, the semiconductor element 11 and the wiring conductor 12 are formed on the surface of the substrate 1 by a semiconductor process or the like before the through hole 2 is formed. The semiconductor element 11 and the wiring conductor 12 are covered with the protective film 3. The protective film 3 protects the semiconductor element 11 and the wiring conductor 12 from chemical damage in dry and wet process such as laser machining, etching, plating and electrodeposition described below, physical damage caused in a dicing step, a mounting and a packaging step after fabrication of the semiconductor device, and also prevents electrical deterioration caused by a current leakage, a wiring short circuit or the like. The electrode pad 10 is formed so as to be exposed out of the protective film 3 and electrically connected to the electroconductive layer 5. Thus, an electrical connection of the semiconductor element 11 on the front surface of the substrate 1 to a side of the back surface is established via the wiring conductor 12, the electrode pad 10 and the electroconductive layer 5.

While in the present invention the space inside the through hole 2 is filled with the filling material 6, the filling material 6 is not necessarily required and the through hole 2 may be left unfilled with the filling material 6 if the electroconductive layer 5 can be maintained with sufficiently high reliability.

A method of manufacturing the semiconductor device shown in FIGS. 1 and 2 will next be described with reference to FIGS. 3A through 3G. Ordinarily, a plurality of semiconductor devices are formed on a substrate such as a semiconductor wafer. After being formed, the plurality of semiconductor devices are cut off and separated from each other by dicing. For ease of illustration, only one semiconductor device is shown in FIGS. 3A through 3G. In FIGS. 3A through 3G, members corresponding to those shown in FIGS. 1 and 2 are indicated by the same numerals.

Figure 3A:
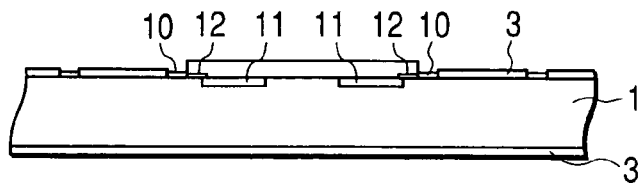
FIGS. 3A, 3B, 3C, 3D, 3E, 3F and 3G are diagrams showing the steps of the process of manufacturing the semiconductor device according to Embodiment 1.

Referring to FIG. 3A, a substrate on which semiconductor elements are formed is prepared. FIG. 3A illustrates the substrate 1, protective layers 3, electrode pads 10, the semiconductor elements 11, and wiring conductors 12. The electrode pads 10, the semiconductor elements 11, and the wiring conductors 12 are formed on the substrate 1 in advance by an ordinary semiconductor process. When these members are formed, an insulating film (not shown) having a thickness of about 0.1 to 3 µm is formed between the electrode pads 10 and the substrate 1 and between the wiring conductors 12 and the substrate 1. A semiconductor substrate is ordinarily used as the substrate 1. A glass substrate, a ceramic substrate or the like may also be used as the substrate 1. However, when the substrate 1 is an insulating substrate such as a glass substrate or a ceramic substrate, the inside surface of through holes is made electroconductive by some means. As the material of the semiconductor substrate, a material may be used which has as its main component a single element such as silicon, germanium or selenium, a compound such as an oxide, a sulfide, a selenide, telluride, an antimony compound, an arsenic compound or a phosphorous compound, an organic semiconductor material. Preferably, as a shape of the substrate 1 a member made of such a material in the shape of a wafer, a rectangular shape, or a polygonal shape is used. An electroconductive substrate of a complicated shape formed by being worked in a complicated manner and conveniently used for micromachines or the like may also be used.

As the material of the protective layer 3, a film of an oxide or a nitride such as SiN, TiN, $SiO_2$, SiO, PSG or BPSG, or a metal such as Ti or Ta may be used. The protective layer 3 is ordinarily formed by a chemical vapor deposition (CVD) method or a physical vapor deposition (PVD) method. If the substrate 1 is composed of silicon, the protective layer 3 may be formed by a thermal oxidation treatment. The film thickness is preferably 0.1 to 3 µm, but is not limited within this range. The protective layer 3 may have any thickness if it can protect the semiconductor elements 11 or the like. Each electrode pad 10 is made of a material whose main component is, for example, gold, silver, aluminum, copper, or silicon, is formed in the shape of a circular ring having a thickness of 0.02 to 5 µm, and is connected to the semiconductor element 11 via the wiring conductor 12. The surface of the electrode pad 10 is exposed out of the protective film 3 to be connected to an electroconductive layer 5 as described below. The thickness of the wiring conductor 12 is 0.02 to 5 µm.

Figure 3B:

Next, referring to FIG. 3B, a through hole 2 is formed inside each of the circular electrode pads 10 formed on the front surface of the substrate 1. As an example of a method of forming this through hole 2, drilling, laser machining, photoexcited anodization and etching are mentioned. One of such methods is selected as desired by considering the material of the substrate 1, the shape and the aspect ratio of the through hole 2, productivity, etc. Laser machining is particularly preferred because it enables the through hole 2 perpendicular to the surface of the substrate 1 to be easily formed and enables efficient use of areas on the front and back surfaces of the substrate 1.

Figure 3C:
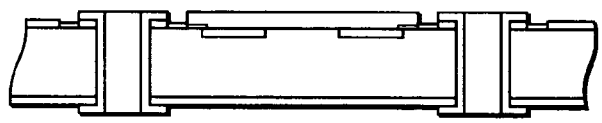

Referring then to FIG. 3C, an insulating layer 4 of an organic material is formed on the inside surface of each through hole 2 and on each of the front and back surfaces of the substrate 1 around the opening ends of the through hole 2. The insulating layers 4 are formed only in portions around the opening ends of the through hole 2 on the front and back surfaces of the substrate 1 by using a mask or the like so as not to be formed on the electrode pad 10 and other members. Alternatively, the insulating layer 4 may be formed so as to cover the surface of the substrate 1 and thereafter etched with a mask covering only the portions surrounding the opening end of the through hole 2. However, the former method is preferable when the costs of the manufacturing apparatus and the manufacturing process are important.

The insulating layer 4 can be formed by a liquid phase method when it is composed of an organic material. When the insulating layer 4 is a layer of an organic material formed by a liquid phase method, it does not cause a failure in the function of the semiconductor element 11 and separation of the electrode pad 10 from the substrate 1 even on the substrate on which the semiconductor element 11 and the electrode pad 10 are formed in advance. The film thickness of the insulating film 4 is preferably 0.05 to 30 µm, but is not limited within this range if leakage between the electroconductive layer 5 formed in the next step and the electroconductive substrate 1 can be prevented. However, it is important to form the insulating layer 4 so that the film thickness is uniform through the entire surface inside the through hole 2.

The liquid phase method used as a method of forming the insulating layer 4 includes dipping, dispensation, printing, electrodeposition, and anodization. The liquid phase method enables use of the substrate on which the semiconductor element 11 and electrode pad 10 are formed in advance since it does not require heating of the substrate to a high temperature of 600° C. or higher. Also, the liquid phase method is a markedly effective means because it enables formation of the film with uniformity even in a case where the aspect ratio of the through hole 2 with respect to the substrate 1 is 5 or higher or in a case where the inside diameter is 100 µm or smaller.

In particular, electrodeposition does not require masking of any portion other than the inside surface of the through hole 2 and the portions surrounding the opening ends since the insulating film is formed only on the surface of the electroconductive member. The electrode pad 10 is exposed out of the protective layer, but is insulated from the substrate 1 by an insulating layer (not shown). Therefore the insulating layer is not formed on the electrode pad 10 by electrodeposition. Although the protective layer covers portions around each of the opening ends of the through hole 2, the insulating layer is also formed on the portions around the opening ends so that the insulating layer on the inside of the through hole 2 rounds the opening ends because the film thickness is small. The insulating layer can be formed with improved film thickness uniformity by electrodeposition. Even when film thickness nonuniformity occurs, the film forming speed at a portion having a larger film thickness is increased because the resistance of this portion is higher, and the film forming speed at a portion having a smaller film thickness is reduced because the resistance is lower. Consequently, the insulating layer can be easily formed with markedly high uniformity on the inside surface of the through hole. The insulating layer can be easily formed with uniformity by electrodeposition even in a case where the inside diameter is 100 μm or smaller or the aspect ratio is 5 or higher.

Also, it is necessary for the insulating layer 4 to have high heat durability in many cases. Therefore it is effective to use a binding resin having higher heat resistance. However, when the insulating layer 4 is formed by a liquid phase method such as electrodeposition, a binder resin capable of curing at a temperature of 600° C. or lower is particularly preferred.

A description will now be made of binder resins. "Binder resin" refers generally to a resin capable of curing by heat, light, an electron beam or the like in the presence of a crosslinking agent, a curing agent or the like, or by self-reaction. The binder resins includes a polyimide resin, a maleimide resin, a polyamide resin, a polyimide-amide resin, a polyester resin, a polyether resin, a bisphenol resin, a denatured epoxy resin, a denatured acrylic resin, a silicone resin, a fluorocarbon resin, a melamine resin, and a resin mixture obtained by suitably combining these resins. Possible kinds of binder resin are a simple binder resin and a kind of resin containing an inorganic material, a ceramic material and/or an organic material.

Some binder resins are obtained by heat bonding at a high temperature of 400° C. or higher. For example, polyimide resins include one obtained in such a manner that a polyamic acid, which is a precursor for polyimide, is cyclized (imidized) by heating reaction at a curing temperature of 400° C. or higher, and one obtained in such a manner that a polyamic acid cyclized (imidized) in advance is cured at a low temperature of 400° C. or lower. The latter corresponds to a binder resin capable of curing at a temperature of 400° C. or lower according to the present invention. Examples of curing reaction in forming such a resin are polymerization reaction, condensation reaction, addition reaction, urethane bonding, urea bonding, ester bonding, ether bonding, carbonate bonding, thiourethane bonding, thioester bonding, thioether bonding, amide bonding, unsaturated bonding, and siloxane bonding. Any of these curing reactions does not occur in the case of the above-mentioned polyimide resin formed in such a manner that a polyamic acid provided as a precursor of the polyimide is cyclized (imidized) by heating reaction at a curing temperature of 400° C. or higher. A maleimide resin, a polyamide resin, a polyimideamide resin, etc., formed in such a manner that a precursor cyclized (imidized) in advance is cured at a low temperature of 400° C. or lower may be used in the present invention, similarly to the above-mentioned polyimide resin.

An inorganic material which may be contained in the binder resin is, for example, magnesium hydroxide, magnesia, alumina, iron oxide, titanium oxide, calcium carbonate, barium sulfate, aluminum silicate, Aerosil, silica, sericite, or a mica.

A ceramic material which may be contained in the binder resin is, for example, an oxide such as tin oxide, titanium oxide, silicon oxide or zinc oxide, a nitride such as silicon nitride, titanium nitride, aluminum nitride or zirconium nitride, a boride such as titanium diboride or zirconium boride, a sulfide such as molybdenum desulfide, iron sulfide, rhenium desulfide, tungsten desulfide, antimony sulfide or bismuth sulfide, a carbide such as silicon carbide or boron carbide, a silicate such as calcium silicate, aluminum silicate, magnesium silicate or diatomaceous earth, or a calcium phosphate compound such as calcium phosphate or hydroxyapatite.

An organic material which may be contained in the binder resin is, for example, a surfactant, a wax, a plasticizer, a gelatinizer, a stabilizer, a dispersant, a leveling agent, a thickener, a rheology control agent, a silane coupling agent, a silicone-denatured oil, a microgel, or a microcapsule.

More specifically, a binder resin prepared by using a cationic polyimide electrodeposition coating material (ElECOAT PI, a product from SHIMIZU CO., LTD.), a cationic maleimide electrodeposition coating material (ELECOAT, a product from SHIMIZU CO., LTD.), and a cationic polyimide electrodeposition coating material (ELECOAT PI, a product from SHIMIZU CO., LTD.), adding as an inorganic material 10% by weight of magnesia (MH-30, a product from Iwatani International Corporation) with respect to the solid content of the polyimide electrodeposition coating material, and mixing and dispersing the inorganic material in the coating material with a sandmill, a binder resin prepared by using a cationic polyimide electrodeposition coating material (ElECOAT PI, a product from SHIMIZU CO., LTD.), adding as a ceramic material 30% by weight of titanium oxide (TTO-55, a product from ISHIHARA SANGYO KAISHA, LTD.) with respect to the solid content of the polyimide electrodeposition coating material, and mixing and dispersing the ceramic material in the coating material with a sandmill, or a binder resin prepared by using a cationic polyimide electrodeposition coating material (ElECOAT PI, a product from SHIMIZU CO., LTD.), adding as an organic material 10% by weight of titanium oxide (JAR-14, a product from JUJO CHEMICAL CO., LTD.) with respect to the solid content of the polyimide electrodeposition coating material, and mixing the organic material in the coating material may be used.

Figure 3D:
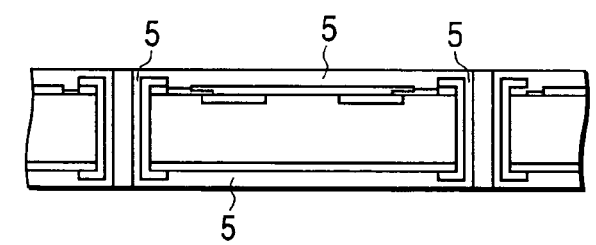

Referring then to FIG. 3D, the electroconductive layer 5 is formed on the inside surface of the insulating layer 4 and on the front and back surfaces of the substrate 1 connecting to the inside surface of the insulating layer. The electroconductive layer 5 is a layer for electric wiring from the front-surface opening side of each through hole 2 provided in the substrate 1 to the back-surface opening side of the through hole 2. The electroconductive layer 5 is formed in a state of being insulated from the substrate 1 by the insulating layer 4 interposed between the electroconductive layer 5 and the substrate 1. Also, the electroconductive layer 5 covers the electrode pads 10 exposed out of the protective layer 3 to be electrically connected to the semiconductor elements 11 connected to the electrode pads 10 by the wiring 12. The electroconductive layer 5 is formed of, for example, copper, nickel, palladium, platinum, gold or silver. The thickness of the electroconductive layer 5 is preferably 0.0.1 μm to 10 μm, but is not limited within this range. The thickness of the electroconductive layer 5 may be set to such a value that reliable conduction is provided between the front and back surfaces of the electroconductive substrate 1, a sufficient process margin and sufficiently high environment resistance are provided, and design value and tolerance requirements or the like are satisfied. PVD or CVD at a processing temperature exceeding 1000° C. cannot be used as a method of forming the electroconductive layer 5. However, dry plating, wet plating, jet printing, or a method of forming a film of an electroconductive paste or a molten metal can be used to form the electroconductive layer 5. The method of forming the electroconductive layer 5 is selected according to the shape and aspect ratio of the through hole 2. It is particularly preferable to use electroless plating because a uniform film can be thereby formed in a short time even on the insulating layer 4.

Figure 3E:
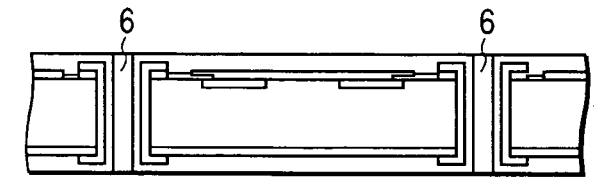

Thereafter, referring to FIG. 3E, the space inside the electroconductive layer 5 on the inside surface of the through hole 2 is filled with filling material 6 to prevent degradation of the electroconductive layer and the insulating layer with the elapse of time due to contamination of foreign materials or contact with external air for example, thereby further improving the reliability of the semiconductor substrate.

As a filling method, PVD or CVD at a processing temperature exceeding 1000° C. cannot be used but a liquid phase method comprising dipping, dispensation, printing or electrodeposition can be used. In particular, when a vacuum pressurization method such as shown in FIGS. 4A through 4D is used, the space inside the through hole 2 can be filled with no void left therein. There is no possibility of a void expanding with increasing temperature to press the electroconductive layer and thereby cause variation in resistance value or a break in the electroconductive layer. The reliability of the semiconductor device can be improved by this method.

FIGS. 4A through 4D illustrate the substrate 1, the through hole 2, the filling material 6, an adhesive tape 20, a mask tape 25 and a squeegee 30. First, referring to FIG. 4A, the opening end of the through hole 2 on the back surface side of the substrate 1 is tightly closed with the adhesive tape 20, which can be easily peeled off. Also, the opening end of the through hole 2 on the front surface side of the substrate 1 is covered with the mask tape 25 and an opening is formed in the mask tape 25 at the position corresponding to the opening end of the through hole, for example, by using laser. The substrate 1 is placed in a vacuum atmosphere in a chamber (not shown) in which a vacuum is maintained.

Figure 4A:
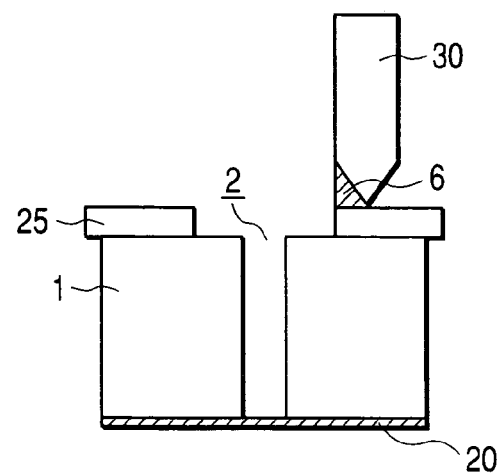
FIGS. 4A, 4B, 4C and 4D are diagrams showing the steps of the process of filling a through hole according to Embodiment 1.
Figure 4B:
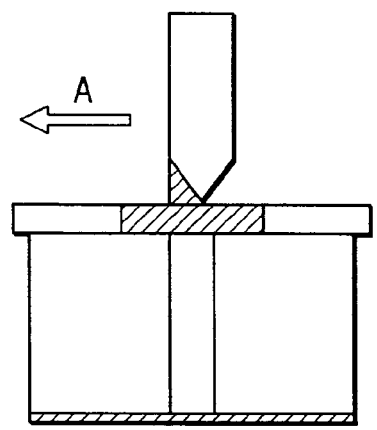

Thereafter, as shown in FIG. 4B, the filling material 6 is applied to the surface of the substrate 1 and the squeegee 30 is moved in the direction of arrow A to form a layer of the filling material 6 covering the front-surface-side opening end of the through hole 2. The space inside the through hole 2 is thereby enclosed completely.

Figure 4C:
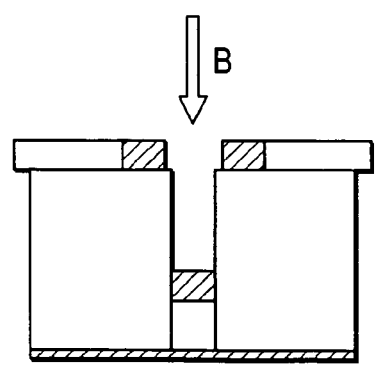

Thereafter, as shown in FIG. 4C, the pressure in the chamber is increased to fill a space inside the through hole 2 with the filling material 6. The enclosed space is formed in the through hole 2 by the adhesive tape 20 and the filling material 6. Even after the pressure in the chamber has been increased, the vacuum state is maintained in the enclosed space. By the pressure difference produced between the vacuum and the increased pressure in the chamber, therefore, the filling material 6 is pressurized in the direction of arrow B and forced toward the bottom of the through hole 2 to fill a space in the through hole 2. If the thickness of the substrate 1 is large, the steps shown in FIGS. 4A through 4C may be repeated to completely fill the through hole 2 with the filling material 6.

Figure 4D:
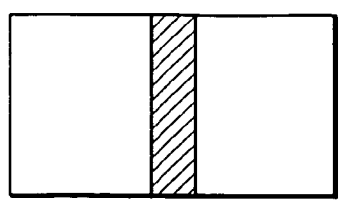

Finally, as shown in FIG. 4D, the filling material 6 on the surface of the electroconductive substrate 1 is removed by separating the mask tape 25, and the filling material 6 in the through hole 2 is then cured by heating or cooling. Further, the adhesive tape 20 adhered to the back surface of the electroconductive substrate 1 is peeled off. Thus, the process of filling the space in the through hole 2 with the filling material 6 is completed without leaving an unfilled portion or a cavity in the through hole 2.

While filling with the filling material 6 is performed by changing the pressure in the chamber, a pressuring means such as a press may be used to reduce a tact required for filling.

The filling material 6 may be an electroconductive metallic material such as copper or silver or an insulating resin material such as polyimide, silicone, amide or epoxy. If an electroconductive material is used, the reliability of conduction via the through hole 2 is improved but there is a possibility of a short circuit at conductors exposed on the surface of the substrate 1 at the time of filling of the through hole 2. Therefore it is preferable to use an insulating resin material. The step of filling with the filling material 6 shown in FIG. 3E is not necessarily required and no filling may be performed, for example, in a case where the inside diameter of the through hole 2 is small.

Figure 3F:
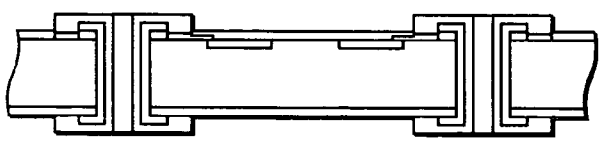

Thereafter, referring to FIG. 3F, patterning is performed on the conducive layer 5 on the front and back surfaces of the substrate 1 by an ordinary photolithography process. Electrical connections are thereby established selectively between the electroconductive layer 5 and the electrode pads 10 provided on the front surface of the substrate 1. On the back surface of the substrate 1, electroconductive wiring is formed by patterning. This patterning may be performed before the step of filling with the filling material 6 shown in FIG. 3E.

Figure 3G:
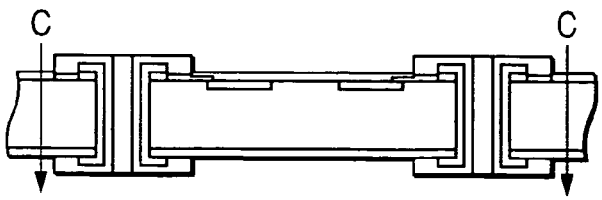

Finally, referring to FIG. 3G, the semiconductor devices are cut by dicing at the positions indicated by arrows C to be separated from each other.

It is possible to realize, by performing the above-described steps, the semiconductor device in which electrical connections from the electrode pads 10 on the front surface of the substrate 1 to a side of the back surface are made by using the through hole formed by the insulating layer 4, the electroconductive layer 5 and the filling material 6. The above-described arrangement ensures that a semiconductor device using a through hole electrode having a high aspect ratio of 5 or higher or a small diameter of 100 μm or smaller can be provided at a low cost without using a process at a high temperature of 600° C. or higher.

Figure 5:
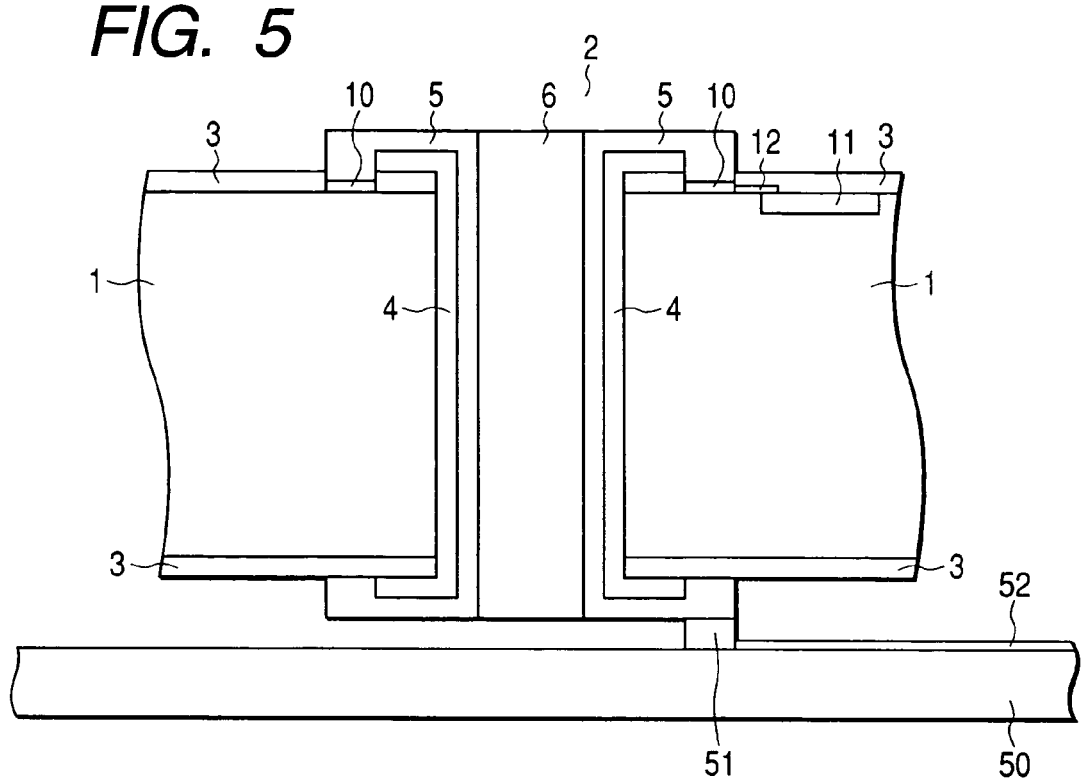
FIG. 5 is a diagram showing electrodeposition in Example 1 of the present invention.

FIG. 5 shows a state in which the above-described semiconductor device is connected to another semiconductor substrate or a circuit board in a master unit. In FIG. 5, the same members as those shown in FIG. 1 are indicated by the same reference characters. The description for the same members will not be repeated. In FIG. 5, the circuit board on the master unit side or the other semiconductor substrate is indicated by 50. An electrode 51 and wiring 52 are provided. The electrode 51 is connected to a wiring formed by the electroconductive layer 5 on the back surface of the above-described substrate 1. Thus, the electrode pad 10 is connected to the semiconductor element on the other semiconductor substrate or the master unit via the electroconductive layer 5, the electrode 51 and the wiring 52.

EXAMPLE 1

Examples of the present invention according to the above-described Embodiment 1 will be described. In Example 1, a semiconductor device was formed according to the form shown in FIG. 1.

First, in a step corresponding to that shown in FIG. 3A, a 6-inch substrate 1 which is a silicon semiconductor substrate is prepared. Electrode pads 10, a semiconductor elements 11 and wiring conductors 12 are provided on a surface of the substrate 1 in advance. Portions other than the electrode pads 10 are covered with a protective layer 3. The thickness of the electrode pad 10 is 0.21 μm and the thickness of the wiring conductor 12 is 0.5 μm. The protective layer 3 is formed of a multilayer of $SiO_2$ and SiN. The thickness of substrate 1 is 625 μm. When these members are formed, an insulating film (not shown) having a thickness of about 0.1 μm is formed between the electrode pad 10 and the substrate 1 and between the wiring conductor 12 and the substrate 1.

Thereafter, in a step corresponding to that shown in FIG. 3B, a through hole 2 is formed by using a laser. An Nd:YAG laser second harmonic (wavelength: 532 nm) was used as the laser to bore the hole with a worked bore diameter of φ80 μm using Q-switch pulse oscillation with a pulse width of 30 nsec at an oscillation frequency of 3 kHz. The fluence at the working surface was set to 65 J/cm$^2$ and the number of shots was set to 100. The laser beam is expanded to a beam diameter of φ500 μm by a combination of optical lenses after being emitted from the laser oscillator. Thereafter, a beam peripheral portion is removed at the time of passage through a mask having a diameter of φ400 μm to obtain a circular beam shape. Next, the beam is condensed by an optical system having a reduction ratio such that the beam diameter on the substrate is 1/5 (φ80 μm). The intensity of the laser beam is thereby increased to a fluence of 65 J/cm$^2$. When the substrate is irradiated with the laser beam, working based on the above-described functions is immediately started. A through hole 2 of φ80 μm was formed on the substrate 1 by the laser beam emitted by 100 oscillation pulse shots. The aspect ratio of the through hole 2 thereby formed is about 7.8.

Figure 6:
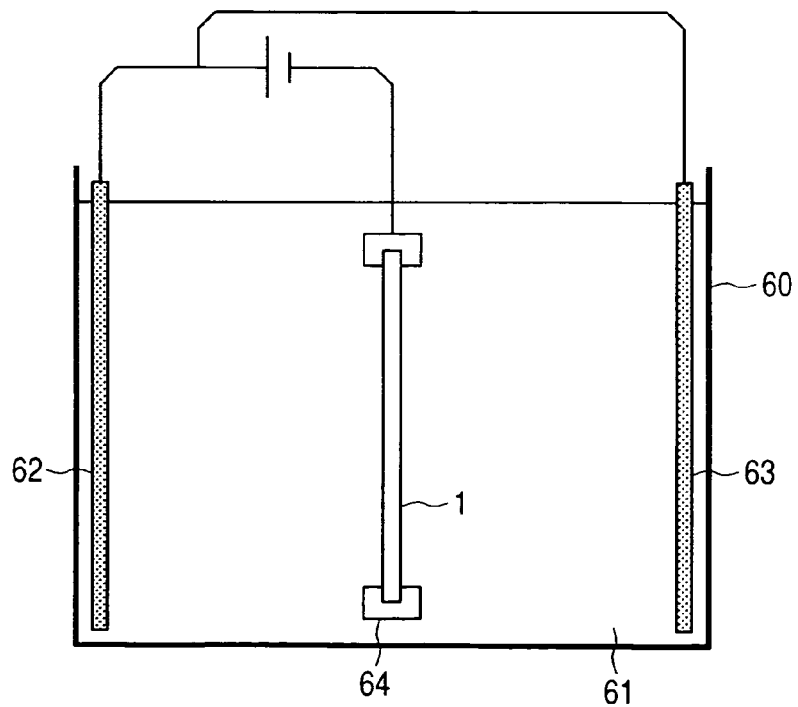
FIG. 6 is a diagram showing a state in which the semiconductor device according to Embodiment 1 is connected to another substrate.

Thereafter, in a step corresponding to that shown in FIG. 3C, an insulating layer 4 is formed on the inside surface of the through hole 2 and on the front and back surfaces of the substrate 1 around the opening ends of the through hole 2. FIG. 6 is a diagram showing a state of electrodeposition. A container 60 is filled with an electrodeposition coating material 61. Electrodes 62 and 63 are placed in the container 60 in a state of facing each other. The substrate 1 obtained in the step shown in FIG. 3B is immersed in the coating material between the electrodes 62 and 63. The substrate 1 is held by a holding means 64. Electrodeposition is performed by connecting a plus terminal of a power supply to the electrodes 62 and 63 and minus terminal of the power supply to the semiconductor substrate 1, and supplying charge through these connections. In FIG. 6, the through hole 2 of the substrate 1, the protective layer 3, etc., are not shown because they are extremely small.

As the electrodeposition coating material, a cationic polyimide electrodeposition coating material (ElECOAT, a product from SHIMIZU CO., LTD.) was used under electrodeposition conditions: 140 V, 120 seconds, and 25° C. and cured in 60 minutes. In this manner, an 8 μm thick insulating layer uniform in thickness was formed. Ordinarily, an insulating film can be formed by electrodeposition when the inside diameter of the through hole 2 is equal to or larger than 5 μm. When the inside diameter of the through hole 2 is smaller than 5 μm, a sufficiently larger amount of the electrodeposition coating material does not enter the through hole and it is therefore difficult to form a uniform film.

Thereafter, in a step corresponding to that shown in FIG. 3D, an electroconductive layer 5 is formed on the inside surface of the insulating layer 4 and on the front and back surfaces of the substrate 1 by electroless plating. Plating was performed under conditions: potassium hydroxide, 75° C., and 5 minutes with a pretreatment solution (Melplate ITO Conditioner 480, Melplate Conditioner 1101, Enplate Activator 440, products from Meltex Inc.) and a Ni plating solution (Melplate NI-867, a product from Meltex Inc.) to obtain a 0.5 μm film, followed by annealing for 30 minutes.

Thereafter, in a step corresponding to that shown in FIG. 3E, the space inside the electroconductive layer 5 on the inside surface of the through hole 2 was filled with a filling material 6 by the above-mentioned vacuum pressurization method. Polyimide ink (FS-510T40S, a product from UBE INDUSTRIES, LTD.) was used as filling material 6. The squeegee attack angle is 25°, the squeegee speed is 30 mm/sec, and the clearance is 1.5 mm. An inner portion of the through hole 2 was filled with the filling material 6 by setting the degree of vacuum in the chamber to 0.2 KPa and by increasing the pressure to 0.2 MPa. After the through hole 2 had been completely filled with the filling material 6, drying at 110° C. for 5 minutes was repeated three times and curing was then performed at 250° C. for 60 minutes.

Thereafter, in a step corresponding to that shown in FIG. 3F, patterning is performed on the electroconductive layer 5 on the front and back surfaces of the semiconductor substrate 1. Patterning was performed by a method described below. A positive type photoresist (OFPR800, a product from TOKYO OHKA KOGYO CO., LTD) was uniformly applied to a thickness of 2 μm by a spin coater, followed by drying at 110° C. for 90 seconds. Exposure was performed with an aligner using a mask according to the patterning and development was performed by using a developer (NMD-W, a product from TOKYO OHKA KOGYO CO., LTD). Subsequently, etching was performed by immersion for 15 minutes in an etching solution containing 10% of phosphoric acid, 40% of nitric acid, and 40% of acetic acid. Finally, the remaining resist was removed by immersion in a resist remover solution (Remover 104, a product from TOKYO OHKA KOGYO CO., LTD), thereby completing the desired patterning. Thus, electrical connections were selectively established between the electrodes 10 and the electroconductive layer 5 provided on the substrate.

Finally, in a step corresponding to that shown in FIG. 3G, the semiconductor devices are cut by dicing using a dicing apparatus to be separated from each other, thus completing the semiconductor device.

A characteristic of the semiconductor device thus formed was measured with a semiconductor electrical characteristic tester. The resistance value was measured by applying a voltage of 100 V between the electroconductive layer 5 on the front surface of the substrate 1 and the electroconductive layer 5 on the back surface of the substrate 1. Table 1 shows changes in conduction resistance value of the semiconductor device in a heat cycle test performed to measure the characteristic. The heat cycle used in the test has, as test conditions, a lower temperature of 65° C. and a higher temperature of 125° C. Generally speaking, if variation in resistance value from the initial resistance value is within 10% during 200 heat cycles, it can be said that there is substantially no influence on the operation of the semiconductor device and the semiconductor device is a good product useful in industry.

TABLE 1

| | Number of cycles | | | | |
|---|---|---|---|---|---|
| | 0 (Initial value) | 50 | 100 | 150 | 200 |
| Resistance value (Ω) | 65 | 66 | 65 | 66 | 66 |

From the results of measurement in the heat cycle test with the semiconductor electrical characteristic tester shown in Table 1, it can be understood that the exhibited resistance value is generally constant irrespective of the number of cycles. That is, it can be said that reliable conduction is provided between the front and back surfaces of the substrate without a break in the electroconductive layer 5 in the through hole and the durability is high enough to ensure suitable industrial use.

Table 2 shows changes in insulation resistance value of the semiconductor device in a constant-temperature constant-humidity test. The resistance value with respect to a small current flowing between the substrate 1 and the electroconductive layer 5 when a voltage of 100 V was applied between the substrate 1 and the electroconductive layer 5 was measured. This test was made by setting constant-temperature constant-humidity conditions: a temperature of 85° C. and humidity of 85% in air. Generally speaking, if the resistance value is 100 MΩ or higher, it can be said that a satisfactory insulation effect is achieved and the semiconductor device is a good product useful in industry. Also, if a resistance value of 100 MΩ is maintained even after a lapse of 100 hours, it can be said that the leakage current is in a negligible range and the semiconductor device can operate normally in the test environment and is a good product useful in industry.

TABLE 2

| | Test time (h) | | |
|---|---|---|---|
| | 0 (Initial value) | 50 | 100 |
| Resistance value (Ω) | 5 × 10E13 | 5 × 10E12 | 3 × 10E12 |

From the results of measurement in the constant-temperature constant-humidity test shown in Table 2, it can be understood that the resistance value was not lower than 100 MΩ even after a lapse of 100 hours. That is, it can be said that the insulating layer 4 is formed in the through hole 2 with almost uniformity in film thickness and without a defective portion, and the durability is high enough to ensure suitable industrial use.

As can be understood from the results of the semiconductor electrical characteristic test shown in Table 1 and the results of the constant-temperature constant-humidity test shown in Table 2, reliable conduction was provided by means of the through hole between the front ant back surfaces and a good semiconductor device having improved durability was formed.

OTHER EXAMPLES

Semiconductor devices were formed by the same methods as that in Example 1 while the thickness of the substrate 1 and the inside diameter of the through hole 2 were changed.

Table 3 shows the results of a heat cycle test and a constant-temperature constant-humidity test on the semiconductor devices. The test number 1 designates the results of the test in the above-described Example 1. While a voltage of 100 V was applied in the semiconductor electrical characteristic test in Example 1, measurement in the other examples was performed by applying a voltage in the range from 15 to 35 V because the voltages actually used in semiconductor devices are within this range.

TABLE 3

| | Test number | | | | | | |
|---|---|---|---|---|---|---|---|
| | 1 | 2 | 3 | 4 | 5 | 6 | 7 |
| Thickness of substrate (μm) | 625 | 300 | 300 | 500 | 625 | 625 | 100 |
| Inside diameter of through hole (μm) | 80 | 10 | 5 | 100 | 100 | 5 | 3 |
| Aspect ratio | 15.6 | 30 | 60 | 5.0 | 6.25 | 125 | 33.3 |
| Heat cycle test | ○ | ○ | ○ | ○ | ○ | ○ | x |
| Constant-temperature constant-humidity test | ○ | ○ | ○ | ○ | ○ | x | x |
| Final results | ○ | ○ | ○ | ○ | ○ | x | x |

○: Good;
x: Bad

As can be understood from Table 3, it was confirmed that a good semiconductor can be formed when the inside diameter of the through hole 2 is 5 to 100 μm, and that a good semiconductor can also be formed when the aspect ratio is 5 to 60.

Embodiment 2

Figure 7:
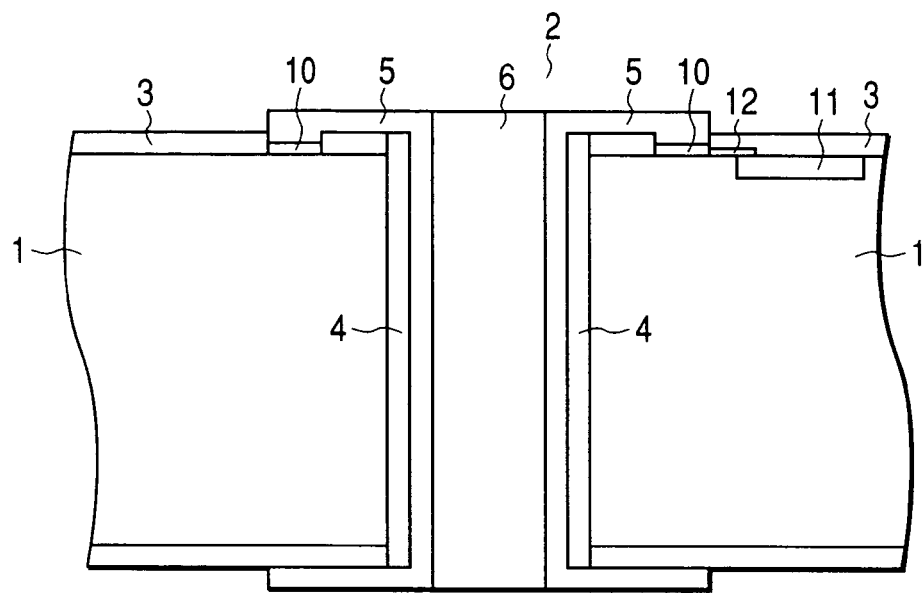
FIG. 7 is a cross-sectional view of another configuration of the semiconductor device according to Embodiment 2 of the present invention.

Embodiment 2 of the present invention will be described with reference to FIG. 7. In FIG. 7, members identical or corresponding to those shown in FIG. 1 are indicated by the same reference characters. FIG. 7 illustrates a substrate 1, a through hole 2, a protective layer 3, an insulating layer 4, an electroconductive layer 5, a filling material 6, an electrode pad 10, a semiconductor element 11, and a wiring conductor 12. In the above-described Embodiment 1, the insulating layer 4 is formed on the inside surface of the through hole 2 and on the front and back surfaces of the substrate 1 around the opening ends of the through hole 2. In this embodiment, the insulating layer 4 is formed only on the inside surface of the through hole 2. The insulating layer 4 in this embodiment is formed in such a manner that a masking insulating film is formed on the protective layer 3 before the insulating layer 4 is formed, and the masking insulating film is peeled off after the formation of the insulating layer 4. The methods of forming the members other than the insulating layer 4 in this embodiment are the same as those in Embodiment 1.

In this arrangement, the insulating layer 4 is formed only on the inside surface of the through hole 2, so that the thickness around the opening ends of the through hole can be reduced to reduce the overall thickness of the semiconductor device.

Embodiment 3

Figure 8:
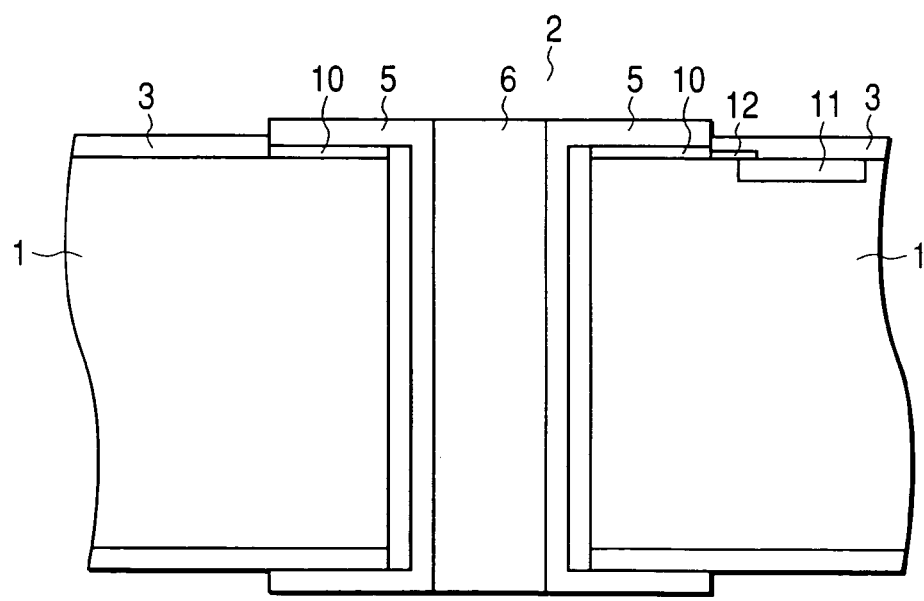
FIG. 8 is a cross-sectional view of another configuration of the semiconductor device according to Embodiment 3 of the present invention.

Embodiment 3 of the present invention will be described with reference to FIG. 8. In FIG. 8, members identical or corresponding to those shown in FIG. 7 are indicated by the same reference characters. FIG. 8 illustrates a substrate 1, a through hole 2, a protective layer 3, an insulating layer 4, an electroconductive layer 5, a filling material 6, an electrode pad 10, a semiconductor element 11, and a wiring conductor 12. In the above-described Embodiment 1, the electrode pad 10 is formed as a circular ring surrounding the opening end of the through hole 2. In this embodiment, the electrode pad 10 is formed in contact with the opening end of the through hole 2 with no given spacing from the opening end. The method of forming the semiconductor device in this embodiment is the same as that in the Embodiment 1.

In this arrangement, no protective layer is formed around and near the opening ends of the through hole 2 and the opening is surrounded by the electrode pad. Ordinarily, the thickness of the protective layer is 0.1 to 6 µm and the thickness of the electrode pad is 0.02 to 5 µm. Therefore the thickness in the vicinity of the opening end of the through hole 2 can be further reduced by an amount corresponding to the difference in thickness.

Embodiment 4

Figure 9:
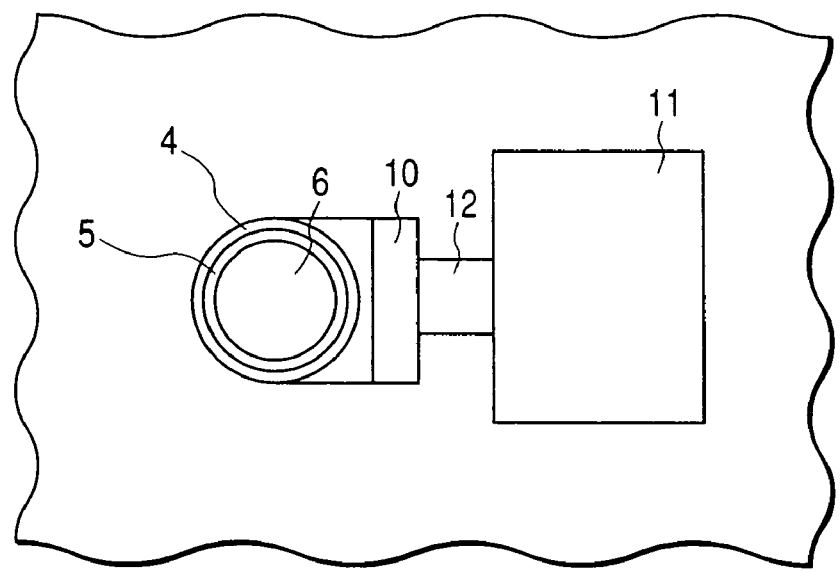
FIG. 9 is a cross-sectional view of another configuration of the semiconductor device according to Embodiment 4 of the present invention.

Embodiment 4 of the present invention will be described with reference to FIG. 9. In FIG. 9, members identical or corresponding to those shown in FIG. 2 are indicated by the same reference characters. FIG. 9 illustrates a substrate 1, a through hole 2, a protective layer 3, an insulating layer 4, an electroconductive layer 5, a filling material 6, an electrode pad 10, a semiconductor element 11, and a wiring conductor 12. In the above-described Embodiment 1, the electrode pad 10 is formed as a circular ring surrounding the opening end of the through hole 2. In this embodiment, the electrode pad 10 is rectangular and is placed by the side of the through hole 2 without surrounding the through hole 2. The electroconductive layer 5 is formed only in one direction from the through hole to a region where the electrode pad 10 is formed.

In this arrangement, the vacant space around the portion provided in the vicinity of the opening end of the through hole 2 for conduction between the front and back surfaces of the substrate is increased, so that the regions on the front and back surfaces of the substrate can be effectively utilized to enable packaging at a higher density.

Embodiment 5

Figure 10:
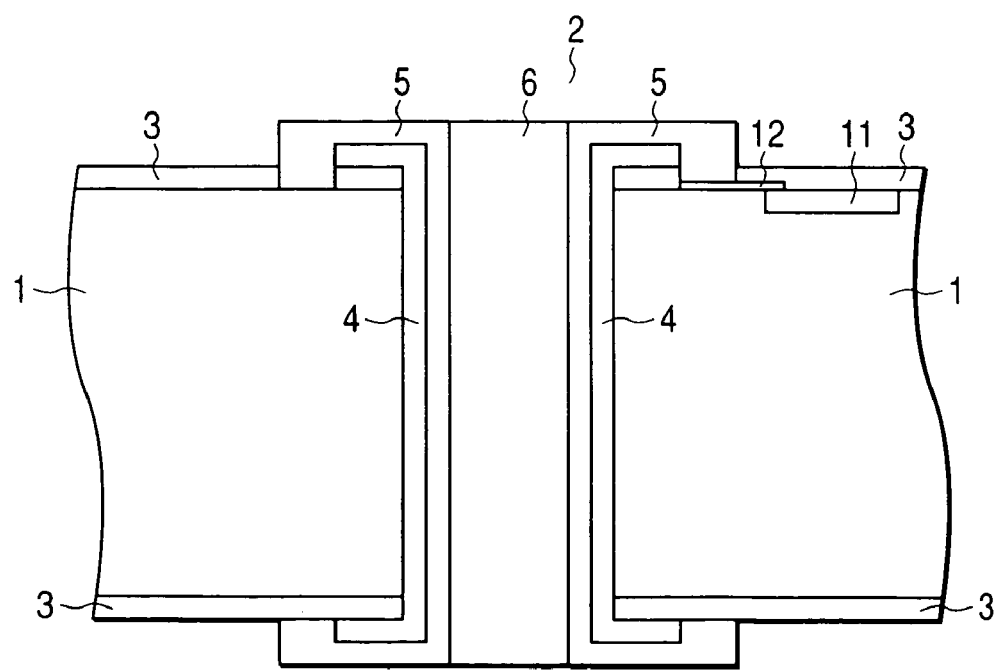
FIG. 10 is a cross-sectional view of another configuration of the semiconductor device according to Embodiment 5 of the present invention.

Embodiment 5 of the present invention will be described with reference to FIG. 10. In FIG. 10, members identical or corresponding to those shown in FIG. 1 are indicated by the same reference characters. FIG. 10 illustrates a substrate 1, a through hole 2, a protective layer 3, an insulating layer 4, an electroconductive layer 5, a filling material 6, a semiconductor element 11, and a wiring conductor 12. In each of the above-described Embodiments 1 to 4, the electrode pad 10 is used as an electrical connection portion. In this embodiment, no electrode pad is used, the wiring conductor 12 is exposed out of the protective layer 3 to be directly connected to the electroconductive layer 5. Since there is no need to form an electrode pad, the manufacturing cost of the semiconductor device can be reduced.

Embodiment 6

Figure 11:
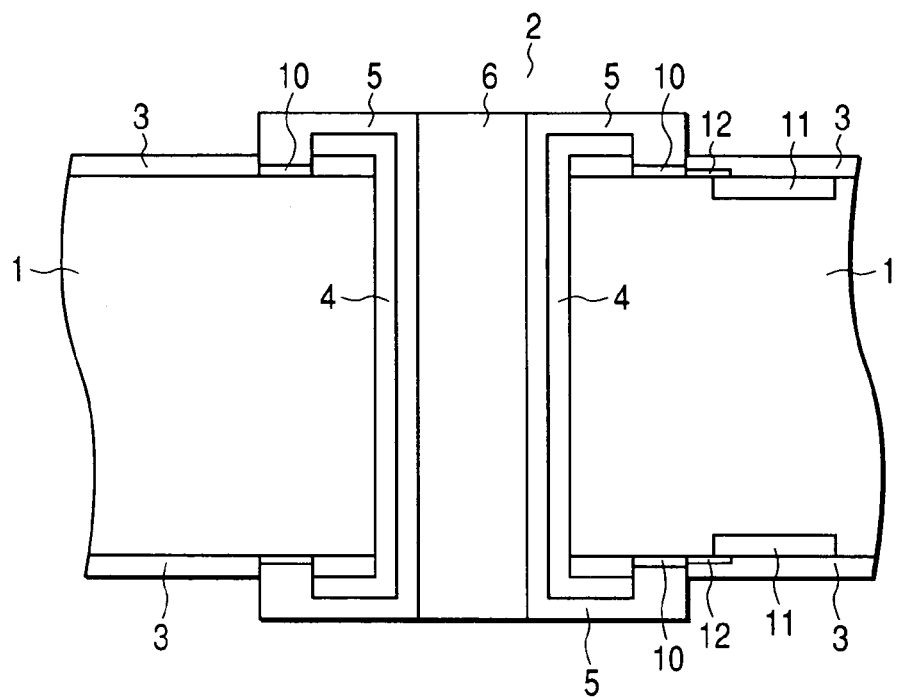
FIG. 11 is a cross-sectional view of another configuration of the semiconductor device according to Embodiment 6 of the present invention.

Embodiment 6 of the present invention will be described with reference to FIG. 11. In FIG. 11, members identical or corresponding to those shown in FIG. 1 are indicated by the same reference characters. FIG. 11 illustrates a substrate 1, a through hole 2, a protective f layer 3, an insulating layer 4, an electroconductive layer 5, a filling material 6, electrode pads 10, semiconductor elements 11, and wiring conductors 12. In this embodiment, the electrode pad 10, the semiconductor element 11 and the wiring conductor 12 are formed on the back surface of the substrate 1, as well as on the front surface, and the semiconductor element 11 on the front surface of the substrate 1 and the semiconductor element 11 on the back surface are electrically connected to each other via the wiring conductors 12, the electrode pads 10 and the electroconductive layer 5.

In this arrangement, the back surface of the substrate 1 can also be used as a surface for forming semiconductor elements, so that the regions on the front and back surfaces of the substrate can be effectively utilized to enable packaging at a higher density.

Embodiment 7

Figure 12:
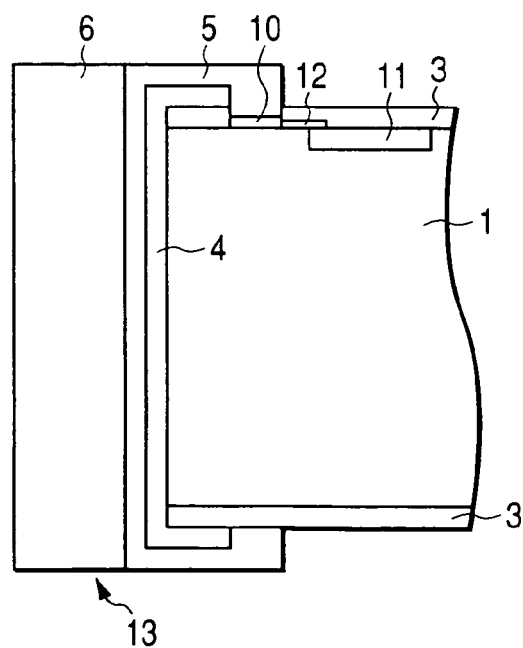
FIG. 12 is a cross-sectional view of another configuration of the semiconductor device according to Embodiment 7 of the present invention.
Figure 13:
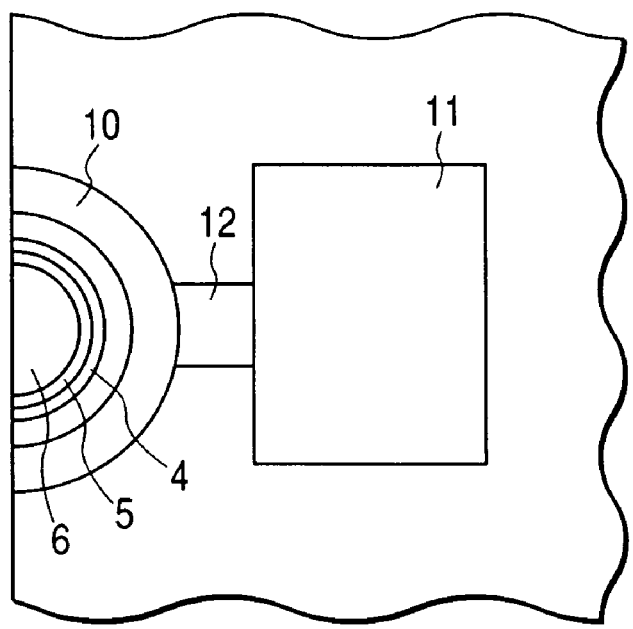
FIG. 13 is a top view of the configuration of the semiconductor device according to Embodiment 7.
Figure 14:
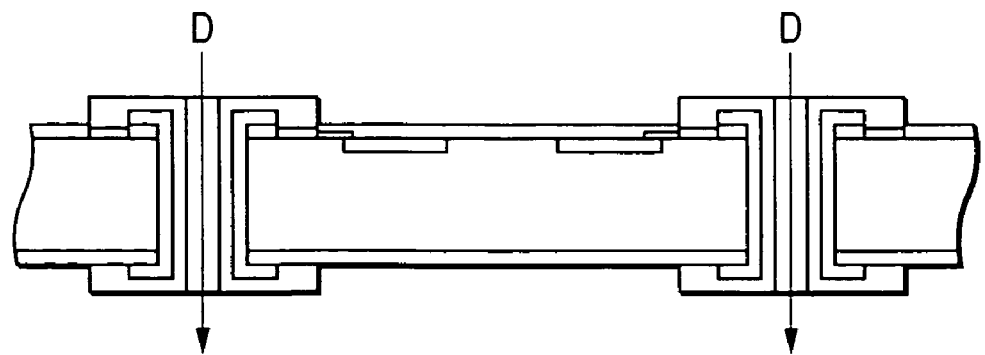
FIG. 14 is a cross-sectional view of the semiconductor device according to Embodiment 7, showing a dicing step.

Embodiment 7 of the present invention will be described with reference to FIGS. 12 and 13. In FIGS. 12 and 13, members identical or corresponding to those shown in FIGS. 1 and 2 are indicated by the same characters. FIGS. 12 and 13 illustrate a substrate 1, a protective layer 3, an insulating layer 4, an electroconductive layer 5, a filling material 6, an electrode pad 10, a semiconductor element 11, and a wiring conductor 12. In each of the above-described Embodiments 1 to 6, the insulating layer 4 and the electroconductive layer 5 are formed on the inside surface of the through hole 2 for conduction between the front and back surfaces of the substrate 1. In this embodiment, a groove 13 is formed in a side surface the substrate 1, and the insulating layer 4 and the electroconductive layer 5 are formed on the inside surface of the groove 13. In a manufacturing method in this embodiment, the substrate 1 is cut at the positions corresponding to the center axes (indicated by arrow D) of the through holes 2 as shown in FIG. 14 instead of being cut at the positions indicated by arrow C in the step shown in FIG. 3G in Embodiment 1. A semiconductor device in which the insulating layer 4 and the electroconductive layer 5 are formed in the side surface of the substrate 1 is thereby fabricated.

In this arrangement, the region located in an outward direction from each through hole 2 in each of Embodiments 1 to 6 can be removed to reduce the width of one semiconductor device (the lateral direction in FIG. 14). Therefore the size of a unit in which the semiconductor device is mounted can be made compact. Also, the number of semiconductor devices formable from one wafer can be increased to reduce the manufacturing cost.

According to the present invention as described above, a semiconductor device and a method of manufacturing the semiconductor device are provided, in which an electrical connection is established between the front and back surfaces of a substrate via at least one through hole formed through the substrate between the front and back surfaces; an electrical connection portion is formed on at least one surface of the front and back surfaces of the substrate in the vicinity of the opening ends of the through hole by a semiconductor process; an insulating layer formed of an organic material is formed on the inside surface of the through hole; an electroconductive layer is formed on the inside surface of the insulating layer; and the electrical connection portion is electrically connected to the electroconductive layer to be electrically connected to a side of the other surface of the substrate. Thus, an improved semiconductor device can be provided in which reliable electrical conduction is provided between the front and back surfaces of the substrate.

The insulating layer is composed of an organic material, particularly a binder resin to be cured at a temperature not higher than 400° C. Therefore the insulating layer can be formed by a liquid phase method. The binder resin is one selected from the group consisting of a denatured epoxy resin, a polyamide resin, a polyimide resin, a maleimide resin, a polyimide-amide resin, a polyester resin, a polyether resin, a bisphenol resin, a denatured acrylic resin, a silicone resin, a fluorocarbon resin, and a melamine resin, or a resin mixture obtained by suitably combining these resins. This resin is cured with one of polymerization reaction-generated bonding, condensation reaction-generated bonding, addition reaction-generated bonding, urethane bonding, urea bonding, ester bonding, ether bonding, carbonate bonding, thiourethane bonding, thioester bonding, thioether bonding, amide bonding, unsaturated bonding, and siloxane bonding. The process of forming the through hole includes no process at a high temperature of 600° C. or higher, such as thermal oxidation processing or chemical vapor deposition. Therefore it is possible to form the through hole on the substrate on which the semiconductor element and the electrical connection portion connecting to the semiconductor element are formed in advance, and to thereby provide conduction between the front and back surfaces of the substrate. Thus, the manufacturing process can be simplified and the manufacturing cost can be reduced.

Also, the through hole perpendicular to the surface of the substrate can be easily formed by laser machining. Therefore the spaces on the front and back surfaces of the substrate 1 can be effectively utilized.

The insulating layer is formed by electrodeposition to be formed only on the inside surface of the through hole without using a mask or the like. Since the uniformity of the film is markedly high, the insulating layer can be formed with uniformity on the inside surface of the through hole even when the aspect ratio of the through hole is 5 or higher or the inside diameter of the through hole is 100 μm or smaller. Therefore no defect occurs in the insulating layer. For this reason, there is substantially no possibility of occurrence of leakage between the electroconductive substrate and the electroconductive layer formed on the inside surface of the insulating layer, which may result in device failure, and the semiconductor device can be formed with improved reliability.

The electroconductive layer is formed by electroless plating. Therefore a uniform electroconductive film can be easily formed even on the surface of the insulating layer in a short time.

The electrical connection portion is formed in the shape of a circular ring so as to encircle the opening end of the through hole, so that a reliable connection can be established between the electrical connection portion and the electroconductive layer.

The space inside the electroconductive layer formed in the through hole is filled with a filling material to prevent degradation of the electroconductive layer and the insulating layer with the elapse of time due to contamination of foreign materials or due to contact with external air for example, thereby further improving the reliability of the semiconductor substrate.

An insulating material may be used as the filling material. In such a case, even if the filling material is attached to the surface of the substrate in the filling step, it does not cause a short circuit of a conductor exposed in the surface of the substrate unlike a electroconductive filling material.

The through hole may be filled with the filling material by the process including the step of putting the electroconductive substrate in a vacuum atmosphere, the step of filling at least part of the through hole with the filling material, and the step of pressurizing the filling material in the through hole. This process ensures that filling can be completed with no void left in the through hole. There is no possibility of a void expanding with increasing temperature to press the electroconductive layer and thereby cause variation in resistance value or a break in the electroconductive layer. Consequently, the reliability of the semiconductor device can be improved.

The insulating layer may be formed only on the inside surface of the through hole. The thickness of the semiconductor substrate in the vicinity of the opening end of the through hole 2 is reduced in this way to reduce the overall thickness of the semiconductor device.

The electrode pad may be formed in contact with the opening end of the through-hole with no given spacing from the opening end. The protective layer in the vicinity of the opening end of the through hole is thereby omitted, so that the thickness of the substrate in the vicinity of the opening end of the through hole can be further reduced.

The electrode pad may be placed by the side of the through hole without surrounding the through hole, and the electroconductive layer may be formed only in one direction on the side of the through hole where the electrode pad is formed. The vacant space around the portion provided in the vicinity of the opening end of the through hole is thereby increased, so that the regions on the front and back surfaces of the substrate can be effectively utilized to enable packaging at a higher density.

The electrical connection may be formed by exposing the wiring conductor out of the protective layer and directly connecting the wiring conductor to the electroconductive layer. The need for forming the electrode pad is thereby eliminated to reduce the manufacturing cost of the semiconductor device.

A semiconductor element formation surface may also be provided in the back surface of the substrate to enable efficient use of the regions on the front and back surfaces of the substrate and to enable packaging at a higher density.

According to the present invention, a method of manufacturing a semiconductor device is also proposed in which a substrate having, on a front surface thereof, an electrical connection portion formed by a semiconductor process is prepared; at least one through hole is formed in the substrate at a predetermined position; an insulating layer formed of an organic material is formed on the inside surface; and an electroconductive layer electrically connected to the electrical connection portion is formed on the inside surface of the insulating layer to electrically connect the electrical connection portion to a side of the back surface of the substrate. The region located in an outward direction from the through hole can be removed in this way to reduce the width of one semiconductor device (the lateral direction in FIG. 13). Therefore the size of a unit in which the semiconductor device is mounted can be made compact. Also, the number of semiconductor devices formable from one wafer can be increased to reduce the manufacturing cost.

What is claimed is:

1. A method of manufacturing a semiconductor device, comprising:
preparing a substrate having an electrical connection portion formed by a semiconductor process on at least one surface of front and back surfaces of the substrate;
forming at least one through hole through the substrate at a predetermined position;

forming an insulating layer of an organic material on at least an inside surface of the through hole; and forming an electroconductive layer on at least an inside surface of the insulating layer to be electrically connected to the electrical connection portion, whereby the electrical connection portion is electrically connected to a side of the other surface of the substrate, wherein the substrate is a semiconductor substrate.

2. A method of manufacturing a semiconductor device, comprising:

preparing a substrate having an electrical connection portion formed by a semiconductor process on at least one surface of front and back surfaces of the substrate;

forming at least one through hole through the substrate at a predetermined position;

forming an insulating layer of an organic material on at least an inside surface of the through hole; and forming an electroconductive layer on at least an inside surface of the insulating layer to be electrically connected to the electrical connection portion, whereby the electrical connection portion is electrically connected to a side of the other surface of the substrate, wherein the through hole is formed by laser machining.

3. A method manufacturing a semiconductor device, comprising:

preparing a substrate having an electrical connection portion formed by a semiconductor process on at least one surface of front and back surfaces of the substrate;

forming at least one through hole through the substrate at a predetermined position;

forming an insulating layer of an organic material on at least an inside surface of the through hole; and forming an electroconductive layer on at least an inside surface of the insulating layer to be electrically connected to the electrical connection portion, whereby the electrical connection portion is electrically connected to a side of the other surface of the substrate, wherein a space inside the electroconductive layer in the through hole is filled with a filling material and the filing material is an insulating material, and wherein the substrate is a semiconductor substrate, and wherein filling of the through hole with the filling material is performed by:

a step of placing the substrate in a vacuum atmosphere;

a step of closing one of opening ends of the through hole;

a step of applying the filling material to a position corresponding to the other opening end in a surface level of the substrate; and a step of pressuring the filling material from the other end of the through hole.

4. A method of manufacturing a semiconductor device, comprising:

preparing a substrate having an electrical connection portion formed on at least one surface of front and back surfaces of the substrate by a semiconductor process;

forming at least one through hole through the substrate at a predetermined position;

forming an insulating layer of an organic material on at least an inside surface of the through hole;

forming an electroconductive layer on at least an inside surface of the insulating layer to be electrically connected to the electrical connection portion to establish an electrical connection between the electrical connection portion and a side of the other surface of the substrate; and cutting the substrate so that the through hole is bisected to form a groove in a side surface of the cut substrate.

5. The method according to claim 4, wherein the organic material comprises a binder resin to be cured at a temperature equal to or lower than 400° C.

6. The method according to claim 4, wherein the binder resin is selected from the group consisting of a denatured epoxy resin, a polyamide resin, a polyimide resin, a maleimide resin, a polyimide-amide resin, a polyester resin, a polyether resin, a bisphenol resin, a denatured acrylic resin, a silicone resin, a fluorocarbon resin, and a melamine resin, or a resin mixture obtained by suitably combining these resins, and is cured with one of polymerization reaction-generated bonding, condensation reaction-generated bonding, addition reaction-generated bonding, urethane bonding, urea bonding, ester bonding, ether bonding, carbonate bonding, thiourethane bonding, thioester bonding, thioether bonding, amide bonding, unsaturated bonding, and siloxane bonding.

* * * * *

UNITED STATES PATENT AND TRADEMARK OFFICE
CERTIFICATE OF CORRECTION

PATENT NO.       : 7,125,810 B2
APPLICATION NO.  : 10/964714
DATED            : October 24, 2006
INVENTOR(S)      : Tadayoshi Muta et al.

It is certified that error appears in the above-identified patent and that said Letters Patent is hereby corrected as shown below:

COLUMN 3:

Line 40, "formed" should read --a formed--;
Line 46, "narily" should read --nary--; and
Line 49, "surf-ace" should read --surface--.

COLUMN 6:

Line 17, "above-describe-d" should read --above-described--; and
Line 26, "from" should read --form--.

COLUMN 12:

Line 21, "EIE-" should read --ELE- --;
Line 34, "EIECOAT" should read --ELECOAT--; and
Line 42, "EIECOAT" should read --ELECOAT--.

COLUMN 15:

Line 9, "a" should be deleted; and
Line 60, "(EIECOAT," should read --(ELECOAT,--.

COLUMN 17:

Line 58, "ant" should read --and--.

COLUMN 20:

Line 30, "the" (first occurrence) should read --of the--.

COLUMN 22:

Line 17, "through-hole" should read --through hole--.

UNITED STATES PATENT AND TRADEMARK OFFICE
CERTIFICATE OF CORRECTION

PATENT NO. : 7,125,810 B2
APPLICATION NO. : 10/964714
DATED : October 24, 2006
INVENTOR(S) : Tadayoshi Muta et al.

It is certified that error appears in the above-identified patent and that said Letters Patent is hereby corrected as shown below:

COLUMN 23:

Line 40, "filing" should read --filling--.

Signed and Sealed this

Twenty-third Day of October, 2007

JON W. DUDAS
*Director of the United States Patent and Trademark Office*